(12) United States Patent
Harata et al.

(10) Patent No.: US 7,540,204 B2
(45) Date of Patent: Jun. 2, 2009

(54) MAGNETOSTRICTIVE TORQUE SENSOR AND ELECTRICALLY POWERED STEERING APPARATUS USING SAME

(75) Inventors: Hitoshi Harata, Haga-machi (JP);
Tomohiro Hoshi, Haga-machi (JP);
Yuichi Fukuda, Haga-machi (JP);
Yukiya Kashimura, Haga-machi (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 11/542,150

(22) Filed: Oct. 4, 2006

(65) Prior Publication Data
US 2007/0074588 A1 Apr. 5, 2007

(30) Foreign Application Priority Data
Oct. 5, 2005 (JP) ............................. 2005-293033

(51) Int. Cl.
*G01L 3/02* (2006.01)
(52) U.S. Cl. ................................. 73/862.331
(58) Field of Classification Search ................................
73/862.331–862.333
See application file for complete search history.

(56) References Cited

U.S. PATENT DOCUMENTS

| | | | | |
|---|---|---|---|---|
| 4,765,425 A | * | 8/1988 | Saito et al. ................... | 180/444 |
| 4,907,460 A | * | 3/1990 | Taniguchi et al. ....... | 73/862.331 |
| 5,280,729 A | * | 1/1994 | Aoki et al. ............. | 73/862.333 |
| 6,422,095 B1 | * | 7/2002 | Shimizu et al. ......... | 73/862.335 |
| 2004/0226384 A1 | * | 11/2004 | Shimizu et al. ................ | 73/762 |
| 2006/0042404 A1 | * | 3/2006 | Shimizu et al. ......... | 73/862.331 |

FOREIGN PATENT DOCUMENTS

JP 2002-082000 A 3/2002

* cited by examiner

*Primary Examiner*—Max Noori
(74) *Attorney, Agent, or Firm*—Arent Fox LLP (57) ABSTRACT

A magnetostrictive torque sensor includes a rotating shaft that is rotated by an applied torque, magnetostrictive films formed around the entire circumferential periphery of a surface of the rotating shaft in at least one location, sensor coils for sensing a change in impedance of the magnetostrictive films, and a torque calculation unit for calculating the torque applied to the rotating shaft on the basis of a signal relating to the change in impedance outputted from the sensor coils. In this magnetostrictive torque sensor, a width of the magnetostrictive films in the axial direction of the rotating shaft and a width of the sensor coils in the axial direction of the rotating shaft are set so as to fulfill the relationship $1<(W1/W2)<1.35$.

10 Claims, 8 Drawing Sheets

MAGNETOSTRICTIVE TORQUE SENSOR AND ELECTRICALLY POWERED STEERING APPARATUS USING SAME

FIELD OF THE INVENTION

The present invention relates to a magnetostrictive torque sensor and an electrically powered steering apparatus that uses the same, and particularly relates to a magnetostrictive torque sensor wherein the sensor sensitivity characteristics can be improved, and the positional misalignment tolerances during assembly of the apparatus can be increased; and to an electrically powered steering apparatus that is manufactured using this sensor.

BACKGROUND OF THE INVENTION

In an electrically powered steering apparatus that is provided as the steering system of an automobile, for example, a steering torque sensor commonly senses a steering torque applied to a steering shaft from a steering wheel by the steering operation of the driver. The steering torque sensor is normally configured from a magnetostrictive torque sensor. The steering shaft functions as a rotating shaft that rotates due to rotational force from the steering operation. The steering shaft constitutes a rotating shaft in the steering torque sensor. The electrically powered steering apparatus controls the driving of a steering force auxiliary motor according to a torque signal sensed from the steering torque sensor, and reduces the steering force for the driver to provide a pleasant steering feel.

As described above, magnetostrictive torque sensors are well known as steering torque sensors used in electrically powered steering apparatuses. In such a magnetostrictive torque sensor, magnetostrictive films that are magnetically anisotropic with respect to each other are formed at two specific locations on the surface of the steering shaft, for example. The magnetostrictive torque sensor has a configuration in which a non-contact system is used to sense changes in the magnetostrictive characteristics of the magnetostrictive films that correspond to the torsion of the steering shaft when torque is applied to the steering shaft from the steering wheel.

In the process of manufacturing a magnetostrictive torque sensor, a magnetostrictive film (in a wider sense, a magnetostrictive region) is formed over the entire circumferential surface in a specific surface in part of the steering shaft; i.e., over a specific axial width in the columnar rotating shaft; and then a process must be performed to provide this magnetostrictive film with magnetic anisotropy. Conventional methods for providing the magnetostrictive film with magnetic anisotropy in the manufacture of a magnetostrictive torque sensor involve applying a twisting torque to a rotating shaft on which a magnetostrictive plating (magnetostrictive film) is formed by an electrolytic plating process, for example, thus creating stress in the circumferential surface of the rotating shaft. This is followed by heat treating the rotating shaft in a thermostat while the shaft is kept under stress (see JP-2002-82000A, for example).

A conventional magnetostrictive torque sensor has, as the sensor configuration for sensing changes in the magnetostrictive characteristics of the magnetostrictive film without contact, a cylindrical sensor coil that encloses the magnetostrictive film around the periphery of the magnetostrictive film. The film is formed over the entire peripheral surface of the columnar rotating shaft. In common conventional magnetostrictive torque sensors, the width of the magnetostrictive film in the axial direction of the rotating shaft (hereinbelow referred to as "magnetostrictive film width") has tended to substantially match the length or width of the sensor coil in the same axial direction (hereinbelow referred to as "sensor coil width"). The magnetostrictive film width and sensor coil width, and the distance between the magnetostrictive film and the inner peripheral surface of the sensor coil (hereinafter referred to as the "gap") are defined as dimensions relevant to the relationship between the sizes and placements of the magnetostrictive film and the sensor coil in the magnetostrictive torque sensor.

Figure 9:
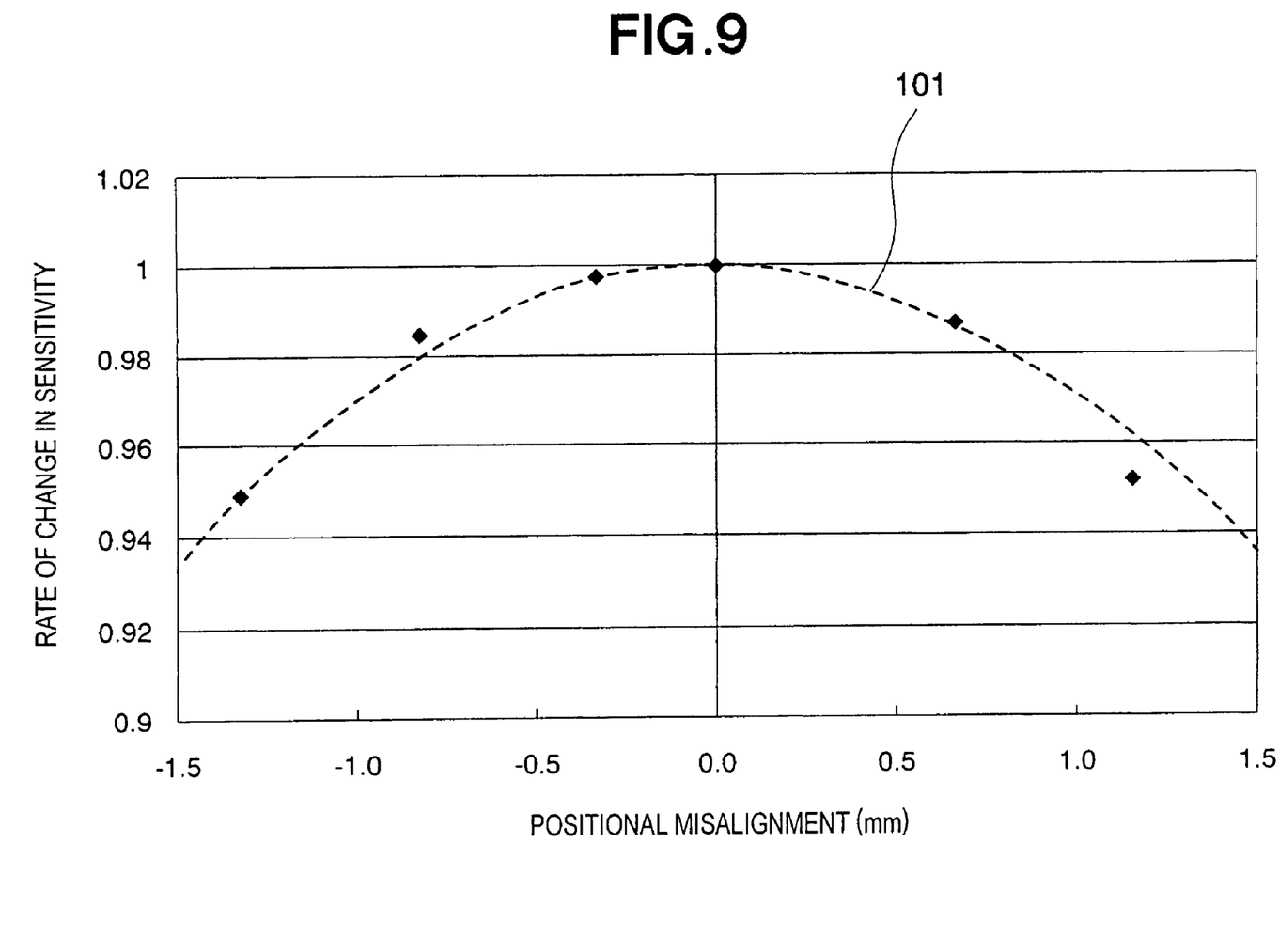
FIG. 9 is a graph showing the relationship between the rate of change in sensitivity of the sensor and the positional misalignment between the magnetostrictive films and the sensor coils in the axial direction of the rotating shaft in a conventional magnetostrictive torque sensor.
Figure 10:
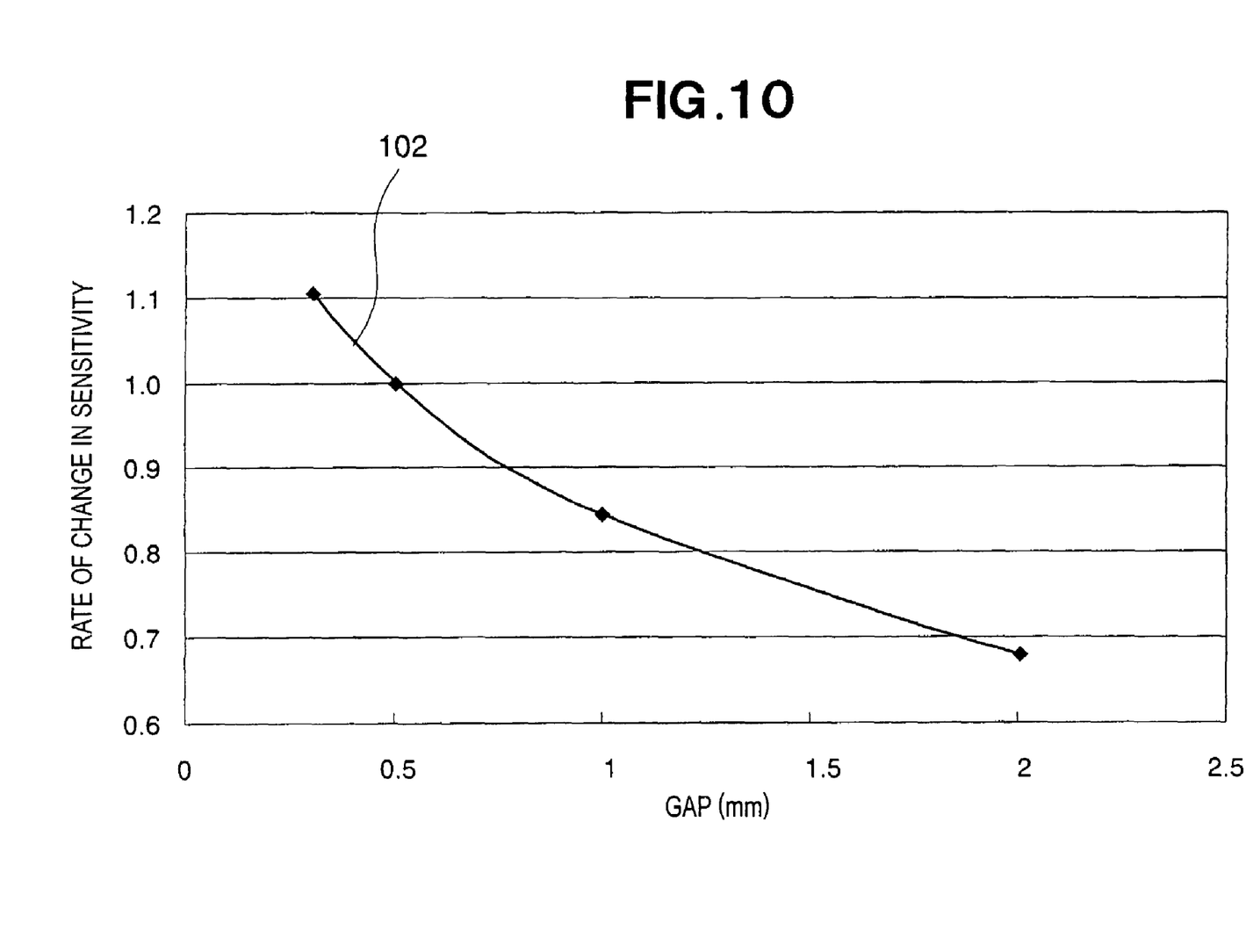
FIG. 10 is a graph showing the relationship between the rate of change in sensitivity of the sensor and the gap between the magnetostrictive films and the sensor coils in a conventional magnetostrictive torque sensor.

The following is a description of the problems relating to the magnetostrictive film width, the sensor coil width, and the gap in a magnetostrictive torque sensor, made with reference to FIGS. 9 and 10.

FIG. 9 shows the relationship between the positional misalignment (horizontal axis: mm) in the axial direction of the rotating shaft between the magnetostrictive film and the sensor coil, and the rate of change in the sensitivity of a conventional magnetostrictive torque sensor the sensor (vertical axis). In this case, the gap is 0.5 mm. FIG. 10 shows the relationship between the gap (space in the radial direction of the rotating shaft, horizontal axis: mm) between the magnetostrictive film and the sensor coil, and the rate of change in the sensitivity of the same magnetostrictive torque sensor (vertical axis).

Using a case with no positional misalignment (0.0 on the horizontal axis, and a rate of change in sensitivity of "1" on the vertical axis) as a reference in the graph 101 in FIG. 9, the rate of change in sensitivity decreases below "1" if positional misalignment occurs either upward (to the right in FIG. 9) or down-ward (to the left in FIG. 9). For example, the rate of change in sensitivity exhibits the characteristic of decreasing below 0.98 when positional misalignment in the axial direction of the rotating shaft exceeds±0.68 mm, for example.

A magnetostrictive torque sensor is a device that requires high sensory precision. Therefore, if the rate of change in sensitivity falls below 0.98, the driver may experience an unpleasant sensation in regard to steering responsiveness in cases in which the sensor is actually installed in an automobile or the like.

According to the graph 102 in FIG. 10, the rate of change in sensitivity is 1.0 in the same manner when the gap on the horizontal axis is 0.5 mm. Based on this value, when the gap is doubled to 1 mm; i.e., when the gap is misaligned by 0.5 mm, for example, the rate of change in sensitivity exhibits the undesirable characteristic of decreasing to about 0.85.

In a magnetostrictive torque sensor, the sensitivity properties of the sensor decrease when positional misalignment occurs in the positional relationship between the magnetostrictive film formed on the rotating shaft and the sensor coil placed around the periphery of the magnetostrictive film. Particularly, when such a magnetostrictive torque sensor is used in an electrically powered steering apparatus of an automobile, it is undesirable for such positional misalignment to occur because the electrically powered steering apparatus creates an unpleasant sensation when operated.

In the environment in which a current electrical power steering apparatus is manufactured, the expected positional misalignment during the assembly process is about 0.2 mm when the sensor coil is attached, and about 0.2 mm when the steering shaft (rotating shaft) is attached. Therefore, there is a possibility that the sensor coil and the steering shaft will be misaligned in position by a maximum of about 0.4 relative to each other.

An electrically powered steering apparatus incorporated into an automobile may undergo a maximum positional misalignment of about 1 mm, including the positional misalignment during manufacturing, due to changes over time or excessive input from the road surface, depending on the environment in which the apparatus is used. Therefore, there is a need for structural resistance to be provided to magnetostrictive torque sensors used in the electrically powered steering apparatuses of automobiles, such that positional misalignment is less than 1 mm even at a maximum, including misalignment that occurs during manufacture and subsequent operation.

Therefore, a need exists for developing a magnetostrictive torque sensor, and an electrically powered steering apparatus that uses this sensor, wherein the dimensional relationship between the shapes of a magnetostrictive film and sensor coil formed on the rotating shaft can be optimized to improve the sensitivity characteristics of the sensor, and the positional misalignment tolerances during assembly of the apparatus can be increased.

SUMMARY OF THE INVENTION

According to one aspect of the present invention, there is provided a magnetostrictive torque sensor comprising a rotating shaft that is rotated by an applied torque, magnetostrictive regions formed around the entire circumferential periphery of a surface of the rotating shaft in at least one location, sensor coils for sensing a change in impedance of the magnetostrictive regions, and a torque calculation unit for calculating the torque applied to the rotating shaft on the basis of a signal relating to the change in impedance outputted from the sensor coils. In this configuration, a width (W1) of the magnetostrictive regions in the axial direction of the rotating shaft and a width (W2) of the sensor coils in the axial direction of the rotating shaft are set so as to fulfill the relationship $1 < (W1/W2) < 1.35$.

In this magnetostrictive torque sensor, increasing the axial width W1 of the magnetostrictive films or other such magnetostrictive regions to be greater than the axial width W2 of the sensor coils, and setting an optimum dimensional relationship, makes it possible to maintain the rate of change in sensitivity of the magnetostrictive torque sensor at a level that does not hinder the use of the electrically powered steering apparatus even in cases in which the positional relationship related to the rotating shaft; i.e., the axial direction of the steering shaft and the sensor coil, is misaligned by about 1 mm in relative terms.

Preverably, the magnetostrictive regions comprise magnetostrictive films produced based on formation of magnetostrictive plating parts on the surface of the rotating shaft.

Desirably, the magnetostrictive films are made of an Ni—Fe alloy. According to another aspect of the present invention, there is provided an electrically powered steering apparatus comprising: a steering shaft; any of the above-described magnetostrictive torque sensors provided on the steering shaft for sensing a steering torque applied to the steering shaft; an electric motor for applying an auxiliary steering force to the steering shaft in accordance with the steering torque sensed by the magnetostrictive torque sensor; and a control unit for controlling the driving of the electric motor on the basis of a signal pertaining to the steering torque sensed from the magnetostrictive torque sensor.

The magnetostrictive torque sensor described above is used as the steering torque sensor provided to the steering shaft that bears the steering force from the steering wheel. Based on the merits of the magnetostrictive torque sensor, it is possible to maintain a satisfactory steering feel in the electrically powered steering apparatus over a long period of time.

The axial width W1 of the magnetostrictive regions is set to have an optimum dimensional relationship with the axial width W2 of the sensor coils in a magnetostrictive torque sensor. Accordingly, the sensitivity of the magnetostrictive torque sensor can be improved, and the positional misalignment tolerances during assembly of the sensor can be increased. Therefore, tolerances are even easier to manage when the sensor apparatus is manufactured. Furthermore, with an electrically powered steering apparatus configured using this magnetostrictive torque sensor, the rate of change in sensitivity of the magnetostrictive torque sensor can be adequately maintained and the steering feel of the electrically powered steering apparatus can be kept at a satisfactory level over a long period of time even in cases in which the axial positional relationship between the steering shaft and the sensor coils becomes misaligned in relative terms in subsequent use.

DESCRIPTION OF THE PREFERRED EMBODIMENTS

Preferred embodiments of the present invention will now be described with reference to the accompanying drawings.

Figure 1:
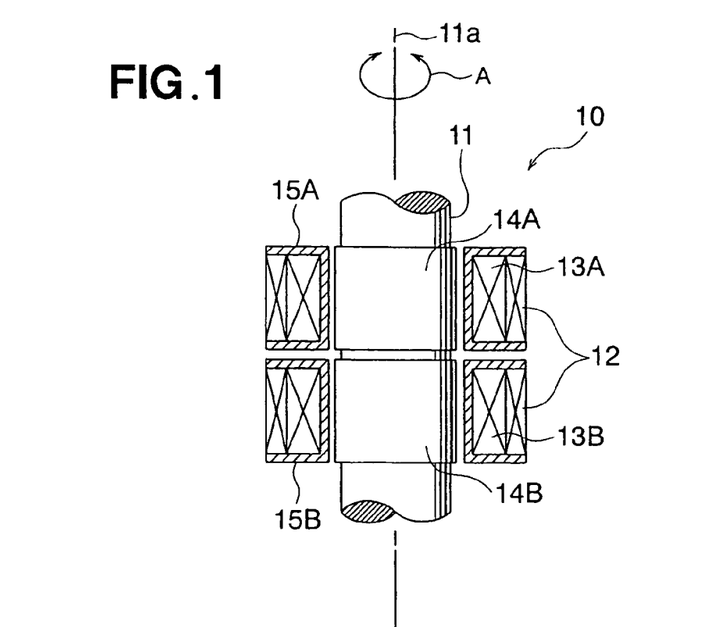
FIG. 1 is a partial cross-sectional side view showing the basic structure of the magnetostrictive torque sensor according to the present invention.
Figure 2:
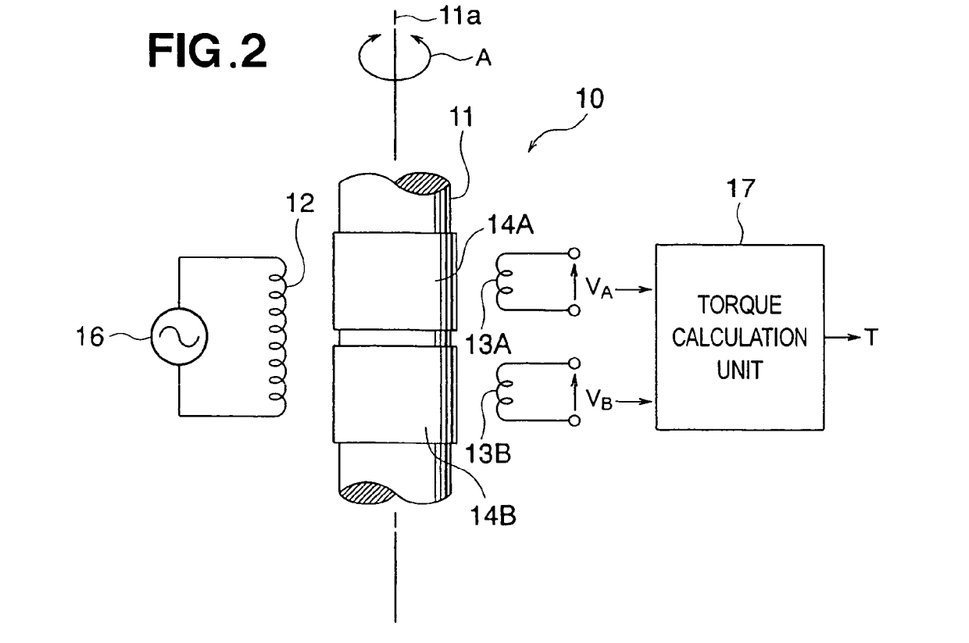
FIG. 2 is a side view schematically showing the basic configuration of the magnetostrictive torque sensor.
Figure 3:
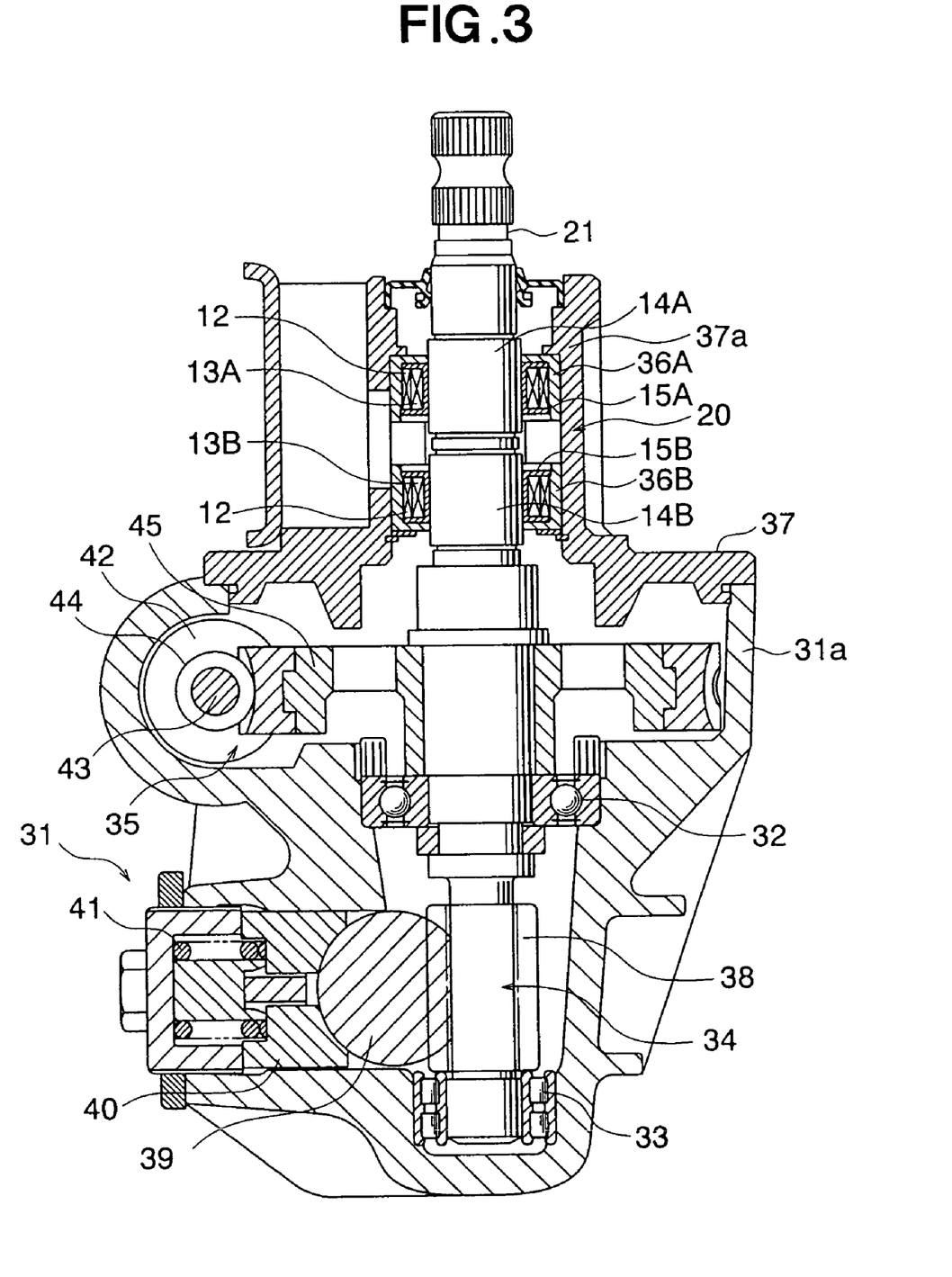
FIG. 3 is a longitudinal cross-sectional view of the main section of a specific structure in which the magnetostrictive torque sensor according to the present invention is incorporated as a steering torque sensor into the steering shaft of an electrically powered steering apparatus.

First, the configuration of the magnetostrictive torque sensor will be described with reference to FIGS. 1 through 3. FIGS. 1 through 3 show a structural example of the magnetostrictive torque sensor according to the present invention.

A magnetostrictive torque sensor 10 is configured from a rotating shaft 11, and one excitation coil 12 and two sensor coils 13A, 13B disposed around the periphery of the rotating shaft 11. For the sake of convenience in the description, the rotating shaft 11 is shown without the top and bottom parts in FIGS. 1 and 2. When the magnetostrictive torque sensor 10 is used as a steering torque sensor in an electrically powered steering apparatus of an automobile, the rotating shaft 11 constitutes part of the steering shaft. This state is shown in FIG. 3.

The rotating shaft 11 has a columnar rod shape and is subjected to the rotational force (torque) of right-hand rotation (clockwise) or left-hand rotation (counterclockwise) around the axis 11a, as shown by the arrow A. The rotating shaft 11 is formed from a metal rod made of chromium-molybdenum steel (SCM) or the like, for example. Magnetostrictive films 14A, 14B are provided to the rotating shaft 11 at two locations aligned vertically in the axial direction. The magnetostrictive films 14A, 14B both have specific widths in the axial direction of the rotating shaft 11, thus fulfilling conditions described later, and also are formed over the entire circumferential periphery of the rotating shaft 11. The dimension of the space between the two magnetostrictive films 14A, 14B is arbitrarily set in accordance with certain conditions.

The magnetostrictive films 14A, 14B are formed on the surface of the rotating shaft 11 as magnetostrictive plating parts by an electrolytic plating process, for example. The magnetostrictive films 14A, 14B, which are magnetically anisotropic, are formed by processing the magnetostrictive plating parts so that magnetic anisotropy is obtained. The method of creating the magnetostrictive films 14A, 14B is not limited to this option alone, however. Also, the regions in which the magnetostrictive films are formed on the rotating shaft 11 should have specific magnetostrictive characteristics, and magnetostrictive regions not limited to magnetostrictive films can be formed.

In the magnetostrictive torque sensor 10, the width (magnetostrictive film width W1) of the magnetostrictive films 14A, 14B in the axial direction of the rotating shaft 11 is set greater than the length or width of the sensor coils 13A, 13B (sensor coil width W2) in the same axial direction so as to fulfill the required conditions described later.

For the sake of convenience in the description, the terms "magnetostrictive films 14A, 14B" and "magnetostrictive plating parts (14A, 14B)" denote the same items, but are used for different purposes depending on the steps and conditions of manufacturing. In principle, the completed products after magnetic anisotropy has been created are referred to as the "magnetostrictive films 14A, 14B," and prior to this step these parts are referred to as "magnetostrictive plating parts."

The excitation coil 12 and the sensor coils 13A, 13B are provided for both of the two magnetostrictive films 14A, 14B formed on the surface of the rotating shaft 11, as shown in FIG. 1. Specifically, the sensor coil 13A is disposed with an interposed a gap from the periphery of the magnetostrictive film 14A, as shown in FIG. 1. The substantially cylindrical ring-shaped sensor coil 13A encircles the entire periphery of the magnetostrictive film 14A, and the width dimension of the sensor coil 13A is less than the width dimension of the magnetostrictive film 14A. Also, the sensor coil 13B is disposed with an interposed gap from the periphery of the magnetostrictive film 14B. The sensor coil 13B similarly encircles the entire periphery of the magnetostrictive film 14B, and the width dimension of the sensor coil 13B is less than the width dimension of the magnetostrictive film 14B. Furthermore, a ring-shaped excitation coil 12 is disposed around the peripheries of the two sensor coils 13A, 13B. In FIG. 1, excitation coils 12 are illustrated as being provided separately to the magnetostrictive films 14A, 14B, but this is a depiction of two portions of what is actually one excitation coil 12. The sensor coils 13A, 13B and the excitation coil 12 are wound around the peripheral space around the magnetostrictive films 14A, 14B using ring-shaped supporting frames 15A, 15B that are provided to the periphery of the rotating shaft 11 so as to encircle the rotating shaft 11.

In FIG. 2, the excitation coil 12 and the sensor coils 13A, 13B are schematically shown in terms of their electrical relationship to the magnetostrictive films 14A, 14B of the rotating shaft 11. An AC power source 16 that constantly supplies an AC excitation current is connected to the excitation coil 12 shared by the magnetostrictive films 14A, 14B. Also, induced voltages $V_A$, $V_B$ corresponding to the torque to be sensed are outputted from the output terminals of the sensor coils 13A, 13B provided to the magnetostrictive films 14A, 14B, respectively.

The induced voltages $V_A$, $V_B$ outputted form the output terminals of the sensor coils 13A, 13B are presented to a torque calculation unit 17. The torque calculation unit 17 computes/calculates the torque applied to the rotating shaft 11 on the basis of the induced voltages $V_A$, $V_B$, and outputs a signal (T) according to the torque. The torque calculation unit 17 is configured from either a microcomputer or another such computing means, or a computing electric circuit.

In the above description, the relationship between the excitation coil 12 and the sensor coils 13A, 13B constitutes a relationship between the primary winding coil and secondary winding coil of a potential transformer.

The magnetostrictive films 14A, 14B formed on the surface of the rotating shaft 11 are magnetically anisotropic magnetostrictive films formed by an electrolytic plating process using Ni—Fe plating, for example. The two magnetostrictive films 14A, 14B are formed so as to be inversely magnetically anisotropic to each other. When torque is applied to the rotating shaft 11 by a rotational force, the reverse magnetostrictive characteristics produced in the magnetostrictive films 14A, 14B are sensed using the sensor coils 13A, 13B disposed around the periphery of the magnetostrictive films 14A, 14B.

The following is a description, made with reference to FIG. 3, of a specific structure in which the magnetostrictive torque sensor 10 is incorporated as a steering torque sensor into the steering shaft of an electrically powered steering apparatus, for example. Elements in FIG. 3 that are substantially identical to those described in FIGS. 1 and 2 are denoted by the same numerical symbols.

FIG. 3 shows the specific configuration of a steering torque sensor 20, a supporting structure for a steering shaft 21, a rack-and-pinion mechanism 34, a power transmission mechanism 35, and a steering force auxiliary motor 42.

In FIG. 3, the top of the steering shaft 21 is joined to the steering wheel (not shown) of the vehicle. The bottom of the steering shaft 21 is configured so as to transmit steering force to a vehicle shaft comprising a rack shaft, via the rack-and-pinion mechanism 34. The steering torque sensor 20 provided at the top of the steering shaft 21 is configured using the magnetostrictive torque sensor 10. The steering torque sensor 20 corresponds to the magnetostrictive torque sensor 10, and the portion of the steering shaft 21 on which the magnetostrictive films 14A, 14B are formed corresponds to the rotating shaft 11.

The steering shaft 21 is rotatably supported by two shaft bearings 32, 33 in a housing 31a that forms a gear box 31. The rack-and-pinion mechanism 34 and the power transmission mechanism 35 are accommodated inside the housing 31a. The steering torque sensor 20 (corresponding to the magnetostrictive torque sensor 10) for the steering shaft 21 (corresponding to the rotating shaft 11) is provided to the upper side of the housing 31a. The above-described magnetostrictive films 14A, 14B are formed on the steering shaft 21, and the excitation coil 12 and sensor coils 13A, 13B corresponding to the magnetostrictive films 14A, 14B are supported by the supporting frames 15A, 15B and yokes 36A, 36B.

In the steering torque sensor 20, the width of the magnetostrictive films 14A, 14B is illustrated to be exaggeratedly large relative to the width of the sensor coils 13A, 13B. However, this is for the sake of convenience in the drawings, and the dimensional relationship between the width of the magnetostrictive films 14A, 14B and the width of the sensor coils 13A, 13B is set so as to fulfill conditions described later.

The top opening of the housing 31a is closed by a lid 37, and this lid 37 is fixed in place on the housing 31a by bolts (not shown). A pinion 38 provided at the bottom end of the steering shaft 21 is positioned between the shaft bearings 32, 33. A rack shaft 39 is guided by a rack guide 40 and is urged by a compressed spring 41 to press against the side of the pinion 38. The power transmission mechanism 35 comprises a worm gear 44 fixed on a transmission shaft 43 that is joined to the output shaft of the steering force auxiliary motor 42, and also comprises a worm wheel 45 fixed on the steering shaft 21. The steering torque sensor 20 is attached to the interior of a cylindrical part 37a of the lid 37.

The steering torque sensor 20 senses the steering torque applied to the steering shaft 21. The sensed value is inputted to a control apparatus (in FIG. 3, not shown) and is used as a reference signal for generating a suitable auxiliary steering torque in an electric motor 42.

When the steering torque from the steering wheel is applied to the steering shaft 21, the steering torque sensor 20 electrically senses changes in the magnetic characteristics of the magnetostrictive films 14A, 14B that correspond to the torsion in the steering shaft 21. The changes are sensed as changes in the induced voltages $V_A$, $V_B$ from the output terminals of the sensor coils 13A, 13B.

Figure 4:
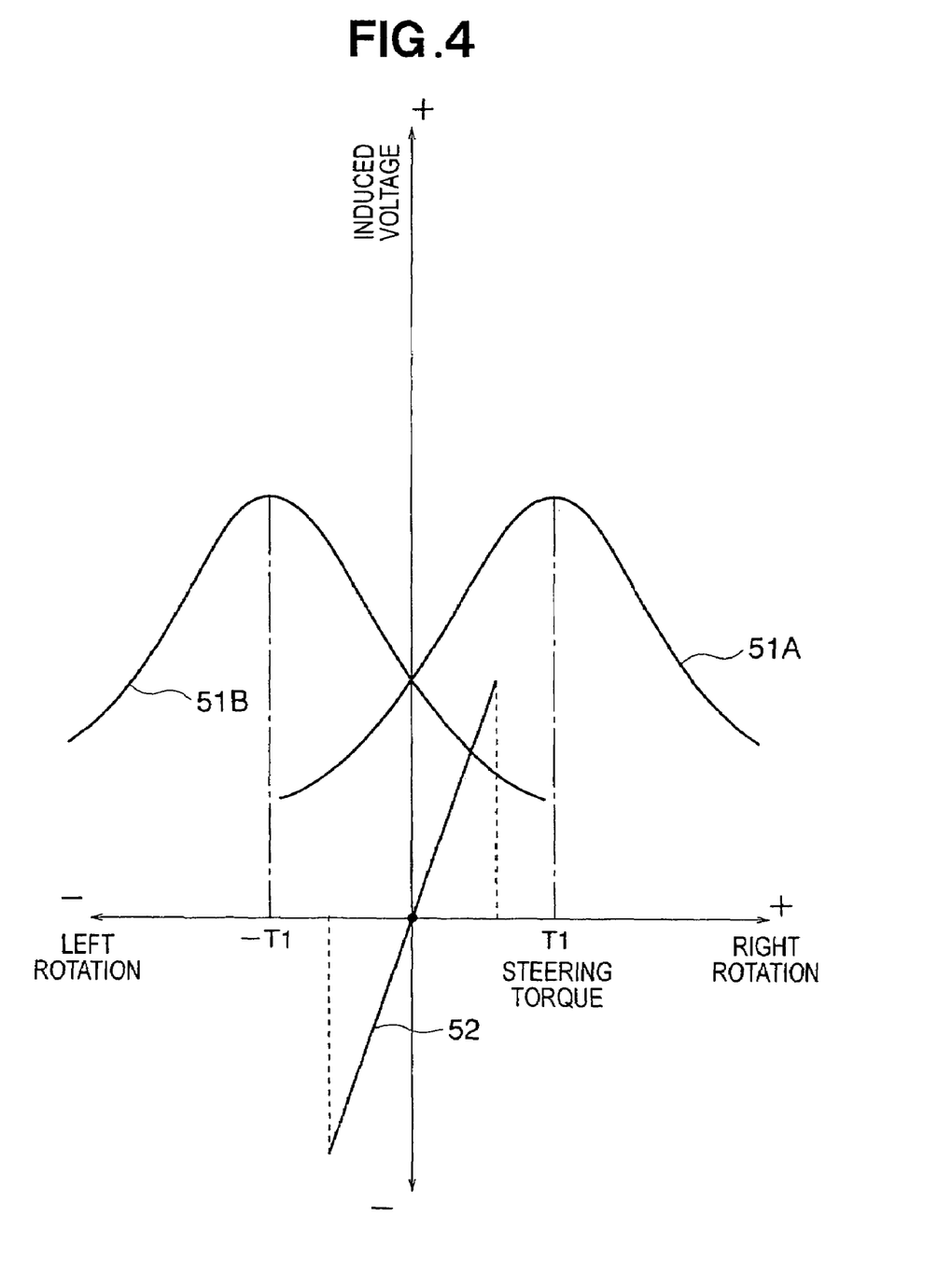
FIG. 4 is a graph showing the sensor detection characteristics and magnetostrictive characteristic curves of sensor coils in the magnetostrictive torque sensor.

Convex magnetostrictive characteristic curves 51A, 51B as shown in FIG. 4, described later, are obtained for each of the two sensor coils 13A, 13B. The magnetostrictive characteristic curves 51A, 51B correspond to the changing characteristics of the induced voltages, which are the sensory outputs from the sensor coils 13A, 13B, respectively.

The steering torque sensor 20 calculates the difference between the induced voltages outputted from the two sensor coils on the basis of the two magnetostrictive characteristic curves 51A, 51B, and senses the rotational direction (to the right or left) and the extent of the steering torque applied to the steering shaft 21, depending on the sign and size of the calculated value.

Torsion occurs in the steering shaft 21 when steering torque acts on the steering shaft 21. As a result, a magnetostrictive effect is created in the magnetostrictive films 14A, 14B. Since an exciting electric current is constantly supplied to the excitation coil 12 from the AC power source 16 in the steering torque sensor 20, the change in the magnetic field resulting from the magnetostrictive effect in the magnetostrictive films 14A, 14B is sensed by the sensor coils 13A, 13B as a change in the induced voltages $V_A$, $V_B$. According to the steering torque sensor 20, the difference between the two induced voltages $V_A$, $V_B$ is outputted as a sensed voltage value on the basis of the change in the induced voltages $V_A$, $V_B$. Therefore, the direction and extent of the steering torque (T) applied to the steering shaft 21 can be sensed based on the outputted voltage ($V_A$-$V_B$) of the steering torque sensor 20.

FIG. 4 will now be further described in detail. FIG. 4 is a view showing the magnetostrictive characteristic curves 51A, 51B of the magnetostrictive films 14A, 14B, respectively, as previously described. In FIG. 4, the horizontal axis represents the steering torque applied to the steering shaft 21, wherein the positive side (+) corresponds to right rotation, while the negative side (−) corresponds to left rotation. The vertical axis in FIG. 4 represents a voltage axis.

The magnetostrictive characteristic curves 51A, 51B for the magnetostrictive films 14A, 14B simultaneously show the sensory output characteristics of the sensor coils 13A, 13B. Specifically, an exciting alternating electric current is supplied by the common excitation coil 12 to the magnetostrictive films 14A, 14B that have the magnetostrictive characteristic curves 51A, 51B; and the sensor coils 13A, 13B respond to this exciting alternating electric current by outputting induced voltages. Therefore, the changing characteristics of the induced voltages of the sensor coils 13A, 13B correspond to the magnetostrictive characteristic curves 51A, 51B of the magnetostrictive films 14A, 14B. In other words, the magnetostrictive characteristic curve 51A shows the changing characteristics of the induced voltage $V_A$ outputted from the sensor coil 13A, while the magnetostrictive characteristic curve 51B shows the changing characteristics of the induced voltage $V_B$ outputted from the sensor coil 13B.

According to the magnetostrictive characteristic curve 51A, the value of the induced voltage $V_A$ outputted from the sensor coil 13A increases in a substantially linear fashion as the value of the steering torque changes from negative to positive and approaches the positive steering torque value T1, then peaks when the steering torque reaches the positive value T1, and gradually decreases as the steering torque increases past T1. According to the magnetostrictive characteristic curve 51B, the value of the induced voltage $V_B$ outputted from the sensor coil 13B gradually increases as the value of the steering torque approaches the negative value −T1, then peaks when the steering torque reaches the negative value −T1, and decreases in substantially linear fashion as the steering torque further increases past −TI and changes from negative to positive.

As shown in FIG. 4, the magnetostrictive characteristic curve 51A pertaining to the sensor coil 13A and the magnetostrictive characteristic curve 51B pertaining to the sensor coil 13B reflect that the magnetostrictive films 14A, 14B are inversely magnetically anisotropic to each other, and have a relationship of substantially linear symmetry about the vertical axis that includes the point where the two magnetostrictive characteristic curves intersect.

The line 52 shown in FIG. 4 indicates a graph that is created based on values obtained in a region that is common to the magnetostrictive characteristic curves 51A, 51B and that has substantially linear characteristics. The values of this line are obtained by subtracting the corresponding values of the magnetostrictive characteristic curve 51B obtained as output voltages of the sensor coil 13B from the values of the magnetostrictive characteristic curve 51A obtained as output voltages of the sensor coil 13A. When the steering torque is zero, the induced voltages outputted from the sensor coils 13A, 13B are equal, and their difference is therefore zero. In the steering torque sensor 20, the line 52 is formed as being a substantially straight line by using the region in the magnetostrictive characteristic curves 51A, 51B that is considered to have a substantially constant slope near the mean point (zero) of the steering torque. The vertical axis in FIG. 4 represents an axis that indicates a zero value of voltage difference for the characteristic graph of the line 52. The line 52, which is a characteristic graph, is a straight line that passes through the origin (0, 0) and lies on the positive and negative sides of both the vertical and horizontal axes. Since the sensory output values of the steering torque sensor 20 are obtained as the difference ($V_A$-$V_B$) between induced voltages outputted from the sensor coils 13A, 13B as previously described, the direction and extent of the steering torque applied to the steering shaft 21 can be sensed based on the use of the straight line 52.

As described above, it is possible to obtain a sensor signal that corresponds to the rotational direction and extent of the steering torque inputted to the steering shaft 21 (rotating shaft 11). The signal is obtained based on the output values of the steering torque sensor 20. Specifically, the rotational direction and extent of the steering torque applied to the steering shaft 21 can be known from the sensor values outputted from the steering torque sensor 20.

In other words, the sensor values of the steering torque sensor 20 are outputted as any of the points on the vertical line 52 in accordance with the steering torque. The steering torque is determined to be rotating to the right when the sensor value is on the positive side of the horizontal axis, and the steering torque is determined to be rotating to the left when the sensor value is on the negative side of the horizontal axis. The absolute value of the sensor value on the vertical axis is the extent of the steering torque. Thus, it is possible to sense the steering torque on the basis of the output voltage values of the sensor coils 13A, 13B by using the characteristics of the vertical line 52.

Figure 5:
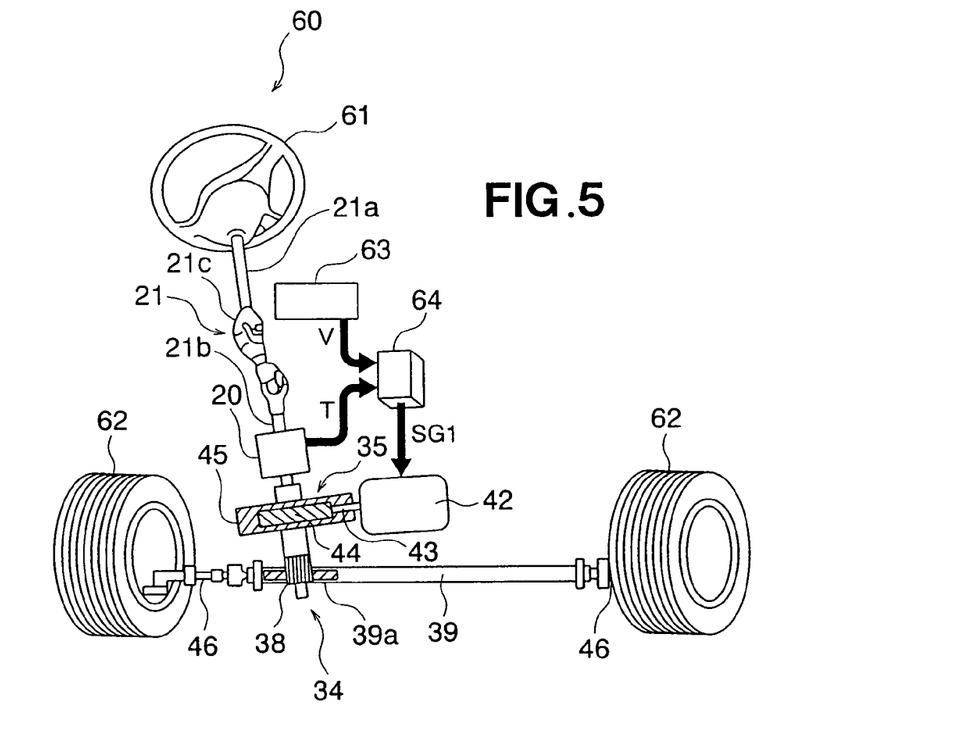
FIG. 5 is a drawing showing the entire configuration of an electrically powered steering apparatus wherein the magnetostrictive torque sensor according to the present invention is incorporated as a steering torque sensor.

The following is a schematic description, made with reference to FIG. 5, of the general configuration and operation of an electrically powered steering apparatus mounted in an automobile, and this description correlates to the structure in FIG. 3. Elements in FIG. 5 that are substantially identical to elements described in FIG. 3 are denoted by the same numerical symbols.

An electrically powered steering apparatus 60 is configured so as to provide an auxiliary steering force (steering torque) to the steering shaft 21 that is connected to a steering wheel 61. The steering shaft 21 is configured from an upper steering shaft 21a whose top end is connected to the steering wheel 61, a lower steering shaft 21b whose bottom end is provided with a pinion gear 38, and a swivel coupling 21c that connects the upper and lower steering shafts 21a, 21b. The pinion gear 38 of the lower steering shaft 21b has a rack shaft 39 provided with a rack gear 39a that meshes with the pinion gear. The rack-and-pinion mechanism 34 is formed by the pinion gear 38 and the rack shaft 39 (rack gear 39a). Tie rods 46 are provided at both ends of the rack shaft 39, and front wheels 62 are attached to the outer ends of the tie rods 46.

The electric motor 42 is provided to the lower steering shaft 21b via the power transmission mechanism 35. The power transmission mechanism 35 is formed by the worm gear 44 and the worm wheel 45. The electric motor 42 outputs a rotational force (torque) that supplements the steering torque, and this rotational force is applied to the lower steering shaft 21b by means of the power transmission mechanism 35.

The steering torque sensor 20 is provided to the lower steering shaft 21b. The steering torque sensor 20 senses the steering torque applied to the steering shaft 21 when the driver operates the steering wheel 61 and applies steering torque to the steering shaft 21.

To be more precise, the steering shaft 21 shown in FIG. 3 represents the lower steering shaft 21b, as is made clear in the above description.

The numerical symbol 63 denotes a speed sensor for sensing the speed of the automobile, and 64 denotes a control apparatus configured from a computer. The control apparatus 64 receives a steering torque signal T outputted from the steering torque sensor 20 and a speed signal V outputted form the speed sensor 63, and outputs a drive control signal SG1 for controlling the operation of the electric motor 42 on the basis of information pertaining to the steering torque and information pertaining to the vehicle speed.

The electrically powered steering apparatus 60 comprises the steering torque sensor 20, the speed sensor 63, the control apparatus 64, the electric motor 42, the rack-and-pinion mechanism 34, and other such components added to the device structure of a regular steering system.

When the driver operates the steering wheel 61 to change the direction in which the vehicle is traveling, the rotational force based on the steering torque applied to the steering shaft 21 is converted by the rack-and-pinion mechanism 34 into linear motion in the axial direction of the rack shaft 39, and the traveling direction of the front wheels 62 is changed via the tie rods 46. At this time, the steering torque sensor 20 provided to the lower steering shaft 21b simultaneously senses the steering torque according to the driver's steering of the steering wheel 61, converts the steering torque into an electrical steering torque signal T, and outputs the steering torque signal T to the control apparatus 64. The speed sensor 63 senses the vehicle speed, converts the speed into a speed signal V, and then outputs this speed signal V to the control apparatus 64. The control apparatus 64 produces a motor electric current for driving the electric motor 42 on the basis of the steering torque signal T and the speed signal V. The electric motor 42 driven by the motor electric current applies an auxiliary steering force to the lower steering shaft 21b via the power transmission mechanism 35. The steering force applied by the driver to the steering wheel 61 is reduced by driving the electric motor 42 as described above.

Figure 6:
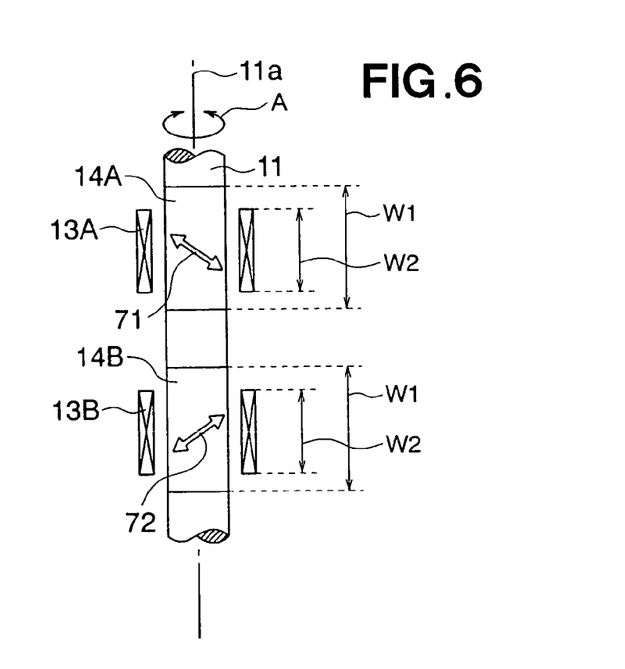
FIG. 6 is a side view in which the positional relationship of mounting the magnetostrictive films and the sensor coils is selectively shown as part of the configuration of the magnetostrictive torque sensor shown in FIG. 1.
Figure 7:
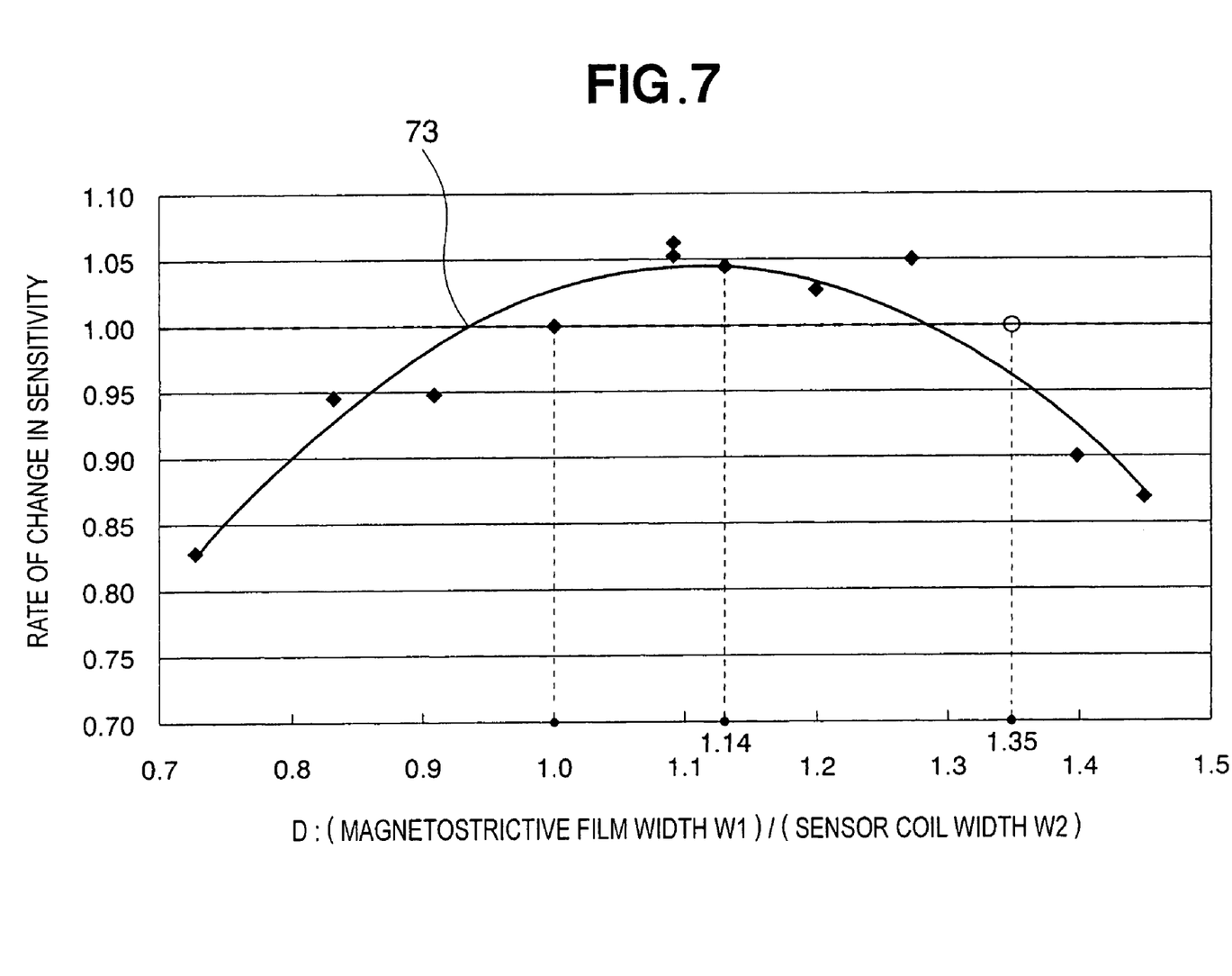
FIG. 7 is a graph showing variations in the rate of change in sensitivity in relation to the ratio D (=W1/W2) between the magnetostrictive film width (W1) and the sensor coil width (W2)
Figure 8:
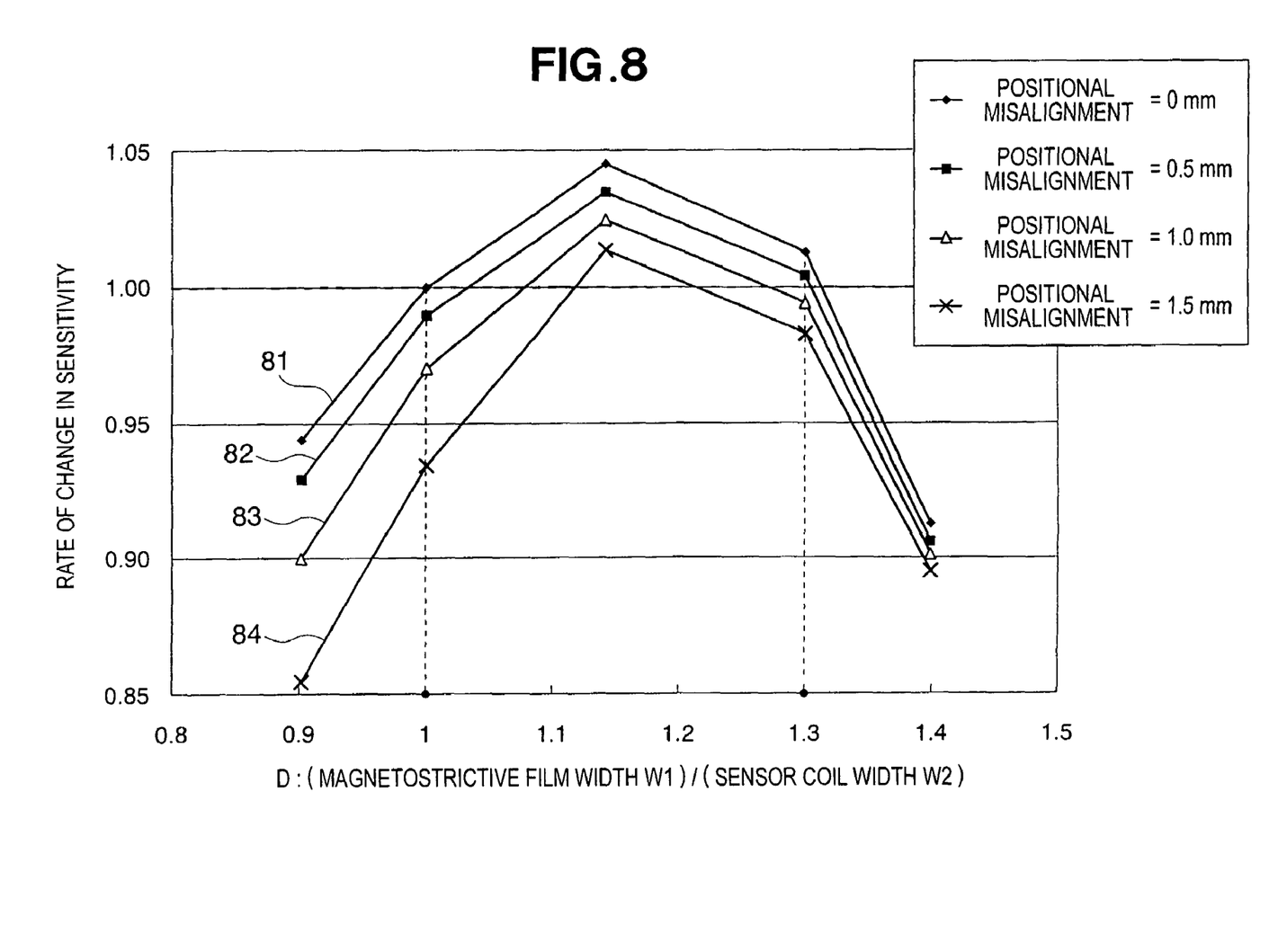
FIG. 8 is a graph showing the relationship between the rate of change in sensitivity of the ratio D and positional misalignment.

Next, a characteristic configuration of the magnetostrictive torque sensor 10 according to the present invention will be described with reference to FIGS. 6 through 8. FIG. 6 is a side view of the configuration of the magnetostrictive torque sensor 10 shown in FIG. 1, selectively showing in exaggerated form the positional relationship of mounting the magnetostrictive films 14A, 14B and the sensor coils 13A, 13B. FIG. 7 is a graph showing variations in the rate of change in sensitivity in relation to the ratio D (=W1/W2) of the magnetostrictive film width (W1) to the sensor coil width (W2). FIG. 8 is a graph showing the relationship between the rate of change in sensitivity of the ratio D and positional misalignment.

In FIG. 6, elements that were described in FIG. 1 are denoted by the same numerical symbols. The width dimension of the magnetostrictive films 14A, 14B in FIG. 6 is denoted by W1, and the width dimension of the sensor coils 13A, 13B is denoted by W2. In FIG. 6, the arrow 71 indicates the direction of the magnetic anisotropy provided to the magnetostrictive film 14A, and the arrow 72 indicates the direction of the magnetic anisotropy provided to the magnetostrictive film 14B.

As shown in FIG. 1, the width W1 of the magnetostrictive films 14A, 14B is greater than the width W2 of the sensor coils 13A, 13B, and the widths are set so that the ratio D (=W1/W2) fulfills the condition 1.0<D<1.35. Fulfilling this condition greatly improves the sensitivity of the magnetostrictive torque sensor 10. The reasons that such a condition is optimal and the basis for deriving this condition will now be described.

First, it has been discovered that the magnetostrictive films 14A, 14B have characteristics whereby sensitivity across the width of the films in the axial direction of the rotating shaft 11 is not uniform, but is high in the middle and low at the ends. The reason that sensitivity is low at the ends of the magnetostrictive films 14A, 14B is because localized lines of magnetic force are present at the ends, and when strain is created in the magnetostrictive films by an applied torque, the inverse magnetostrictive characteristics created by the magnetic anisotropy 71, 72 are reduced by the lines of magnetic force. Conversely, if the sensor coils are too narrow, the ratio of the lines of magnetic force present in the sensor coils and the magnetostrictive films is reduced, and sensitivity decreases.

Variations in the rate of change in sensitivity for the ratio D between the magnetostrictive film width W1 and the sensor coil width W1 shown in FIG. 7 was measured with the gap between the magnetostrictive films and the sensor coils set to 0.5 mm. In the graph 73 obtained by the least-square method shown in FIG. 7, the rate of change in sensitivity exceeds 1 when D=1, increases as D increases from 1, and peaks when D=1.14. The rate of change in sensitivity decreases as D increases thereafter, and is less than 1 when D exceeds 1.35. As described above, the rate of change in the sensitivity of the magnetostrictive torque sensor 10 increases or decreases depending on the value of the ratio D; i.e., on the ratio (W1/W2) of the magnetostrictive film width W1 to the sensor coil width W2, and is substantially greater than 1 when 1.0<D<1.35.

Among the graphs in FIG. 8, which show the relationship of positional misalignment to the rate of change in sensitivity of the ratio D, graph 81 corresponds to a positional misalignment or 0 mm, graph 82 to a positional misalignment of 0.5 mm, graph 83 to a positional misalignment of 1.0 mm, and graph 84 to a positional misalignment of 1.5 mm. The term "positional misalignment" refers to the positional misalignment between the magnetostrictive films 14A, 14B and the sensor coils 13A, 13B in the axial direction of the rotating shaft 11. It is clear from the graphs 81 through 84 in FIG. 8 that the rate of change in sensitivity in a positional misalignment range of 0 to 1 mm is substantially greater than 1 when the ratio D is within a range of 1<D<1.3.

In a conventional magnetostrictive torque sensor, the rate of change in sensitivity falls below 0.98 when the positional misalignment exceeds 0.68 mm. Referring to FIG. 8, by setting D to an optimum value, the rate of change in sensitivity can be set to a range that does not fall below 0.98 even in cases in which the positional misalignment exceeds 1.5 mm.

According to the graphs of FIGS. 7 and 8, using the magnetostrictive torque sensor 10 according to the present embodiment makes it possible to set the range of optimum values of D as 1<D<1.35, which is above the rate of change in sensitivity of the sensor. Here, the value D=1 for a conventional magnetostrictive torque sensor is used as a reference. A value in the range 1.03<D<1.30, in which the rate of change in sensitivity does not fall below 0.98, can be set as a more preferred value, based on 1.0 mm as the maximum positional misalignment expected when the magnetostrictive torque sensor 10 is used as the steering torque sensor 20 in an automobile.

Since the value of D that corresponds to the maximum rate of change in sensitivity is about 1.14 as shown in FIG. 7, increasing the magnetostrictive film width W1 to be greater than the sensor coil width W2 as described above makes it possible to obtain a magnetostrictive torque sensor having the highest possible sensor sensitivity characteristics. Also, setting the value of D to the optimum level makes it possible to keep the rate of change in sensitivity at or above 0.98 even in cases in which the rate of change in sensitivity decreases with an increase in the gap shown in FIG. 10.

Obviously, various minor changes and modifications of the present invention are possible in light of the above teaching. It is therefore to be understood that within the scope of the appended claims the invention may be practiced otherwise than as specifically described.

What is claimed is:

1. A magnetostrictive torque sensor comprising:
a rotating shaft that is rotated by an applied torque;
a plurality of magnetostrictive regions formed around an entire circumferential periphery of a surface of the rotating shaft, wherein each magnetostrictive region of the plurality of magnetostrictive regions has a magnetic anisotropy different from that of another magnetostrictive region;
sensor coils for sensing a change in impedance of the magnetostrictive regions; and
torque calculating means for calculating the torque applied to the rotating shaft on the basis of a signal corresponding to the change in impedance outputted from the sensor coils, wherein
the magnetostrictive torque sensor has a rate of change in sensitivity greater than or equal to 0.98, and a width W1 of the magnetostrictive regions in an axial direction of the rotating shaft and a width W2 of the sensor coils in the axial direction of the rotating shaft are set to fulfill the relationship 1<(W1/W2)<1.35 so as to keep the rate of change in sensitivity of the magnetostrictive torque sensor at or above 0.98.

2. The magnetostrictive torque sensor of claim 1, wherein the magnetostrictive regions are magnetostrictive films produced based on formation of magnetostrictive plating parts on the surface of the rotating shaft.

3. The magnetostrictive torque sensor of claim 2, wherein a material of the magnetostrictive films is an Ni—Fe alloy.

4. An electrically powered steering apparatus for a vehicle comprising:
a steering shaft;
a magnetostrictive torque sensor provided on the steering shaft for sensing a steering torque applied to the steering shaft, the magnetostrictive torque sensor comprising a plurality of magnetostrictive regions formed around the entire circumferential periphery of a surface of the steering shaft, wherein each magnetostrictive region of the plurality of magnetostrictive regions has a magnetic anisotropy different from that of another magnetostrictive region, sensor coils for sensing a change in impedance of the magnetostrictive regions, and torque calculating means for calculating the torque applied to the steering shaft on the basis of a signal corresponding to the change in impedance outputted from the sensor coils, and wherein the magnetostrictive torque sensor has a rate of change in sensitivity greater than or equal to 0.98, and a width W1 of the magnetostrictive regions in the axial direction of the steering shaft and a width W2 of the sensor coils in the axial direction of the steering shaft being set to fulfill the relationship 1<(W1/W2)<1.35 so as to keep the rate of change in sensitivity of the magnetostrictive torque sensor at or above 0.98;
an electric motor for applying an auxiliary steering force to the steering shaft in accordance with the steering torque sensed by the magnetostrictive torque sensor; and
control means for controlling the driving of the electric motor on the basis of a signal pertaining to the steering torque sensed from the magnetostrictive torque sensor.

5. The electrically powered steering apparatus of claim 4, wherein the magnetostrictive regions of the magnetostrictive torque sensor are magnetostrictive films produced based on formation of magnetostrictive plating parts on the surface of the steering shaft, 6. The electrically powered steering apparatus of claim 5, wherein the magnetostrictive films are formed of an Ni—Fe alloy.

7. The magnetostrictive torque sensor of claim 1, wherein the magnetostrictive regions are separate and distend from each other.

8. The electrically powered steering apparatus of claim 4, wherein the magnetostrictive regions are separate and distend from each other.

9. The magnetostrictive torque sensor of claim 1, wherein the width W1 of the magnetostrictive regions in the axial direction of the rotating shaft and the width W2 of the sensor coils in the axial direction of the rotating shaft are set to fulfill the relationship $1.03<(W1/W2)<1.30$.

10. The electrically powered steering apparatus of claim 4, wherein the width W1 of the magnetostrictive regions in the axial direction of the steering shaft and the width W2 of the sensor coils in the axial direction of the steering shaft are set to fulfill the relationship $1.03<(W1/W2)<1.30$.

* * * * *